United States Patent
Fan et al.

(10) Patent No.: US 10,607,974 B2
(45) Date of Patent: Mar. 31, 2020

(54) MICRO LED DISPLAY AND MANUFACTURING METHOD THEREOF

(71) Applicant: OmniVision Semiconductor (Shanghai) Co., Ltd., Shanghai (CN)

(72) Inventors: Regis Fan, Shanghai (CN); Pei-Wen Ko, Shanghai (CN); Chun-Sheng Fan, Hsinchu (TW)

(73) Assignee: OMNIVISION SEMICONDUCTOR (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/120,835

(22) Filed: Sep. 4, 2018

(65) Prior Publication Data

US 2020/0027865 A1 Jan. 23, 2020

(30) Foreign Application Priority Data

Jul. 19, 2018 (CN) .......................... 2018 1 0799085

(51) Int. Cl.
| | |
|---|---|
| *H01L 25/16* | (2006.01) |
| *H01L 25/075* | (2006.01) |
| *H01L 33/00* | (2010.01) |
| *H01L 33/54* | (2010.01) |
| *H01L 33/58* | (2010.01) |

(Continued)

(52) U.S. Cl.
CPC ........ *H01L 25/167* (2013.01); *H01L 25/0753* (2013.01); *H01L 25/165* (2013.01); *H01L 33/007* (2013.01); *H01L 33/54* (2013.01); *H01L 33/58* (2013.01); *H01L 33/62* (2013.01); *H01L 33/32* (2013.01); *H01L 33/40* (2013.01);

(Continued)

(58) Field of Classification Search
CPC ....................................................... H01L 33/54
See application file for complete search history.

(56) References Cited

U.S. PATENT DOCUMENTS

| | | | |
|---|---|---|---|
| 2017/0358624 A1* | 12/2017 | Takeya | ................. H01L 27/156 |
| 2018/0206298 A1* | 7/2018 | Chen | ....................... H01L 27/32 |

FOREIGN PATENT DOCUMENTS

TW  I471055  1/2015

OTHER PUBLICATIONS

"First office action," TW Application No. 107130751 dated May 15, 2019 (with English translation of search report portion only).

* cited by examiner

*Primary Examiner* — William A Harriston
(74) *Attorney, Agent, or Firm* — Womble Bond Dickinson (US) LLP

(57) ABSTRACT

A micro LED display and a manufacturing method thereof are disclosed. A plurality of electrode structures is formed on a first surface of a substrate, and a plurality of circuit structure are formed in the substrate, where the circuit structures are electrically connected to the electrode structures. An LED functional layer is formed on the substrate, and includes a plurality of mutually isolated LED functional structures, where the LED functional structures are corresponding and electrically connected to the electrode structures. An electrode layer covers the LED functional layer and is electrically connected to the LED functional structures. Micro lenses are formed on the electrode layer and corresponding to the LED functional structures. Therefore, all the LED functional structures can be wholly used as a light-emitting region of a pixel, improving light emission efficiency of the micro LED display.

19 Claims, 12 Drawing Sheets

(51) Int. Cl.
*H01L 33/62* (2010.01)
*H01L 33/40* (2010.01)
*H01L 33/32* (2010.01)

(52) U.S. Cl.
CPC .................. *H01L 2933/005* (2013.01); *H01L 2933/0033* (2013.01); *H01L 2933/0058* (2013.01)

MICRO LED DISPLAY AND MANUFACTURING METHOD THEREOF

CROSS-REFERENCES TO RELATED APPLICATIONS

This application claims the priority of Chinese patent application number 201810799085.2, filed on Jul. 19, 2018, the entire contents of which are incorporated herein by reference.

TECHNICAL FIELD

The present invention relates to the field of semiconductor manufacturing technologies, and in particular, to a micro LED display and a manufacturing method thereof.

BACKGROUND

As compared with conventional passive light-emitting LCD technology, active light-emitting display technology has higher energy efficiency, higher contrast, and wider color gamut. At present, the OLED active light-emitting display technology has been applied in products such as mobile phones and television screens, and achieves excellent color performance. However, the OLED is much worse than the LED in terms of energy efficiency and service life. A high-efficiency long-life micro LED display array, as another active light-emitting display technology, has become a hot spot in the development of new technology. However, the light emission efficiency of a high-resolution micro LED display is relatively poor, and its manufacturing process is more complicated and difficult than that of an OLED display. How to provide a micro LED display that has high light emission efficiency and reduced fabrication difficulty becomes a technical problem in urgent need to be solved by persons skilled in the art.

SUMMARY OF THE INVENTION

An objective of the present invention is to provide a micro LED display and a manufacturing method thereof, so as to solve the problem of poor light emission efficiency of the micro LED display in the prior art.

To solve the foregoing technical problem, the present invention provides a micro LED display, which includes:

a substrate having a plurality of electrode structures formed on a first surface thereof, wherein a plurality of circuit structures are formed in the substrate and electrically connected to the plurality of electrode structures;

an LED functional layer, formed on the substrate and including a plurality of LED functional structures which are mutually isolated from one another, wherein the plurality of LED functional structures are correspondingly and electrically connected to the plurality of electrode structures;

an electrode layer, covering the LED functional layer and electrically connected to the plurality of LED functional structures; and a plurality of micro lenses, formed on the electrode layer and corresponding to the plurality of LED functional structures.

Alternatively, in the micro LED display, a rewiring layer is formed on a second surface of the substrate; and the micro LED display further includes metal pillars, the metal pillars running through the LED functional layer and the substrate, and being electrically connected to the rewiring layer and the electrode layer.

Alternatively, in the micro LED display, the micro LED display further includes an isolation sidewall formed between each of the metal pillars and the LED functional layer, as well as between each of the metal pillars and the substrate.

Alternatively, in the micro LED display, a periphery of the micro LED display is a tilted plane; a rewiring layer is formed on the second surface of the substrate, and extends across the periphery of the micro LED display and is electrically connected to the electrode layer.

Alternatively, in the micro LED display, a peripheral region of the electrode layer is covered with the plurality of micro lenses.

Alternatively, in the micro LED display, the micro LED display further includes a PCB board, and the circuit structures are further electrically connected to the PCB board.

Alternatively, in the micro LED display, the micro LED display further includes a plurality of isolation structures each running through the LED functional layer and formed between two adjacent ones of the plurality of LED functional structures.

Alternatively, in the micro LED display, the micro LED display further includes a connection layer that is formed between the substrate and the LED functional layer.

Alternatively, in the micro LED display, the connection layer is made from a conductive adhesive.

Alternatively, in the micro LED display, each of the plurality of LED functional structures includes a P-type semiconductor layer, an N-type semiconductor layer, and a transition layer between the P-type semiconductor layer and the N-type semiconductor layer.

Alternatively, in the micro LED display, the electrode layer is made from a transparent and conductive material.

The present invention further provides a method of manufacturing a micro LED display, which includes:

providing a substrate, wherein the substrate is provided with a plurality of chip areas, a plurality of electrode structures are formed on a first surface of the substrate, a plurality of circuit structures are formed in the substrate, and the plurality of circuit structures are electrically connected to the plurality of electrode structures;

forming an LED functional material layer on the substrate, wherein the LED functional material layer covers the plurality of chip areas;

etching the LED functional material layer to form a plurality of LED functional structures and first openings, each of the first openings running through the LED functional material layer and formed between two adjacent ones of the plurality of LED functional structures;

forming isolation structures in the first openings, wherein each of the isolation structures fills a corresponding one of the first openings;

covering the plurality of LED functional structures with an electrode layer, wherein the electrode layer also covers the isolation structures;

forming a plurality of micro lenses on the electrode layer, wherein the plurality of micro lenses are corresponding to the plurality of LED functional structures; and slicing the plurality of chip areas to form multiple independent chip structures.

Alternatively, in the method of manufacturing a micro LED display, the LED functional material layer entirely covers the plurality of chip areas; or the LED functional material layer includes a plurality of LED functional material regions, and each of the plurality of LED functional material region covers a corresponding one of the plurality of chip areas.

Alternatively, in the method of manufacturing a micro LED display, after slicing the plurality of chip areas to form multiple independent chip structures, the method of manufacturing a micro LED display further includes:

mounting the multiple independent chip structures on a PCB board, wherein the plurality of circuit structure are further electrically connected to the PCB board.

Alternatively, in the method of manufacturing a micro LED display, the method of manufacturing a micro LED display further includes: concurrently with or prior to or after the formation of the first openings: etching the LED functional material layer and the substrate to form second openings that run through the LED functional material layer and the substrate; and wherein the method of manufacturing a micro LED display further includes, before the formation of the electrode layer: forming metal pillars in the second openings, wherein the metal pillars fill the second openings.

Alternatively, in the method of manufacturing a micro LED display, after the plurality of micro lenses are formed, the method of manufacturing a micro LED display further includes:

forming a V-shaped notch between two adjacent ones of the plurality of chip areas, wherein the V-shaped notch runs through the substrate and the LED functional material layer to expose the electrode layer; and forming a rewiring layer on a second surface of the substrate, wherein the rewiring layer extends across a sidewall of the V-shaped notch and is electrically connected to the electrode layer.

In the micro LED display and the manufacturing method thereof according to the embodiments of the present invention, a substrate is provided with a plurality of electrode structures on its first surface, where a circuit structure is formed in the substrate and electrically connected to the electrode structures; an LED functional layer is located on the substrate, and includes a plurality of mutually isolated LED functional structures, where the LED functional structures are corresponding and electrically connected to the electrode structures; an electrode layer covers the LED functional layer and is electrically connected to the LED functional structures; and micro lenses are located on the electrode layer and corresponding to the LED functional structures. Therefore, all the LED functional structures can be wholly used as a light-emitting region of a pixel, improving light emission efficiency of the micro LED display.

Further, in the method of manufacturing the micro LED display provided by the present invention, an LED functional material layer is formed on the substrate, where the LED functional material layer covers the chip areas; and the LED functional material layer is etched, so as to form a plurality of LED functional structures and first openings that run through the LED functional material layer and are separately located between two adjacent LED functional structures, such that alignment between the LED functional structures and the substrate can be implemented. Thus, the difficulty in manufacturing the micro LED display can be reduced, and the quality and reliability of the formed micro LED display can be improved.

100—Micro LED display; 100a—Independent chip structure; 110—Substrate; 111—Chip area; 120—Electrode structure; 130—Circuit structure; 140—LED functional layer; 141—LED functional material layer; 150—LED functional structure; 150a—P-type semiconductor layer; 150b—N-type semiconductor layer; 150c—Transition layer; 151—First opening; 160—Electrode layer; 161—Color resistance layer; 161a—White phosphor coating; 161b—Color filter; 161c—Black baffle wall; 170—Micro lens; 180—Isolation structure; 181—Isolation layer; 190—Connection layer; 200—Rewiring layer; 210—Metal pillar; 220—Metal pad; 230—Isolation sidewall; 240—PCB board.

DETAILED DESCRIPTION

A micro LED display and a manufacturing method thereof provided by the present invention are further described in detail below with reference to the accompanying drawings and specific embodiments. Advantages and features of the present invention will be clearer according to the following description and appended claims. It should be noted that the accompanying drawings are in a very simplified form and all use non-precise scales, and are merely used for the purpose of conveniently and clearly making auxiliary description of the embodiments of the present invention. In particular, due to factors such as the effects of the illustrations, the various drawings generally employ different display scales.

Figure 1:
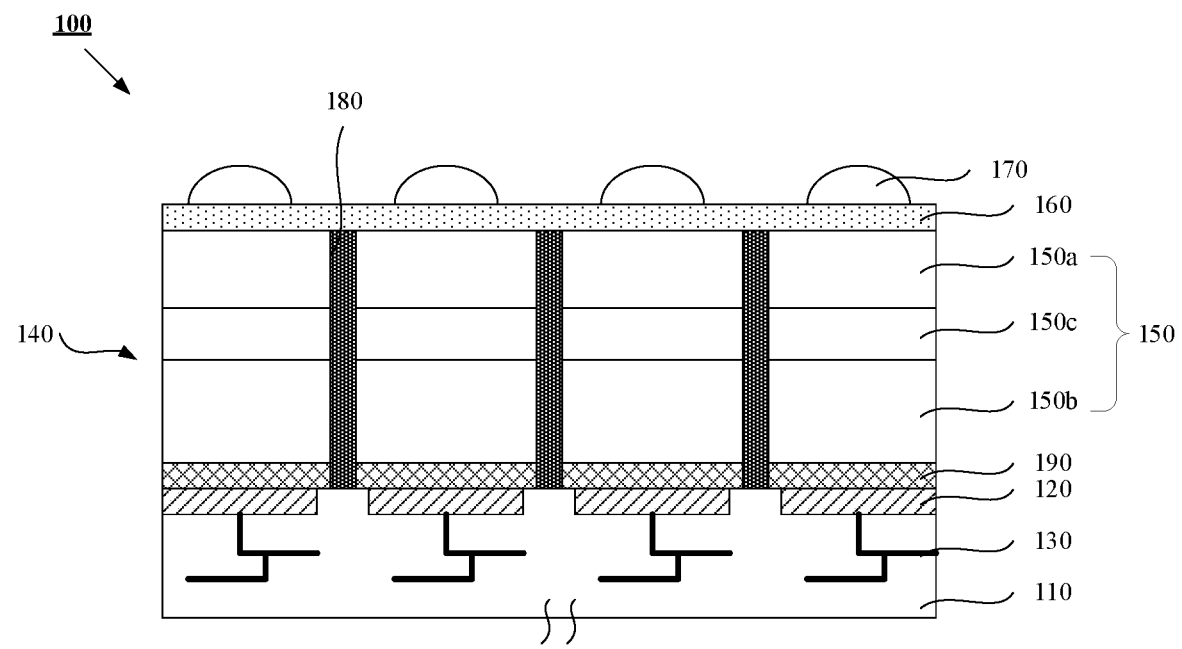
FIG. 1 is a schematic structural diagram of a part of a micro LED display according to an embodiment of the present invention.

First, refer to FIG. 1, which is a schematic structural diagram of a part of a micro LED display according to an embodiment of the present invention. As shown in FIG. 1, the micro LED display 100 includes: a substrate 110, wherein a plurality of electrode structures 120 are formed on the first surface of the substrate 110, and a circuit structure 130 is formed in the substrate 110 and electrically connected to the electrode structures 120; an LED functional layer 140, located above the substrate 110 and including a plurality of mutually isolated LED functional structures 150, where the LED functional structures 150 are corresponding and electrically connected to the electrode structures 120; an electrode layer 160, covering the LED functional layer 140 and electrically connected to the LED functional structures 150; and a plurality of micro lenses 170, located on the electrode layer 160 and corresponding to the LED functional structures 150.

In the embodiment of the present application, the substrate 110 is specifically a semiconductor substrate which may be a silicon substrate. The circuit structure 130 may be formed in the substrate 110 by means of an existing semiconductor process. The circuit structure 130 may be a control circuit for controlling light emission of the LED functional structures 150, or may also be another logical control circuit. Further, the circuit structure 130 may include multiple separated sub-circuits that are electrically connected to the electrode structures 120 in a one-to-one correspondence manner. The circuit structure 130 may also include an integrally and electrically connected sub-circuit, and the electrode structures 120 are all electrically connected to the sub-circuit.

Referring to FIG. 1 continuously, the electrode structures 120 are formed on the first surface (for example, the front side) of the substrate 110. The electrode structures 120 may protrude from the first surface of the substrate 110, or the surfaces of the electrode structures 120 are flush with the first surface of the substrate 110. The electrode structure 120 may be made from metal, such as gold, silver, platinum, copper, aluminum, nickel, cobalt, etc. or an alloy containing any one of the above metals. The electrode structure 120 may be formed by means of an existing semiconductor process. For example, the electrode structure 120 may be formed by means of a combination of a deposition process and an etching process, or a combination of an etching process, a deposition process and a grinding process, or the like.

In the embodiment of the present invention, the LED functional structure 150 specifically includes a P-type semiconductor layer 150a, an N-type semiconductor layer 150b, and a transition layer 150c between the P-type semiconductor layer 150a and the N-type semiconductor layer 150b. Herein, the P-type semiconductor layer 150a of the LED functional structure 150 may be disposed near the substrate 110, or the N-type semiconductor layer 150b of the LED functional structure 150 may be disposed near the substrate 110. That is, from the first surface of the substrate 110, the LED functional structure 150 may be formed by successively stacked P-type semiconductor layer 150a, transition layer 150c and N-type semiconductor layer 150b, or formed by successively stacked N-type semiconductor layer 150b, transition layer 150c and P-type semiconductor layer 150a. The P-type semiconductor layer 150a may be specifically a P-type gallium nitride layer, the N-type semiconductor layer 150b may be specifically an N-type gallium nitride layer, and the transition layer 150c may have a structure of multiple quantum wells (MQWs).

Further, the micro LED display 100 may include multiple isolation structures 180, where the multiple isolation structures 180 run through the LED functional layer 140 and are separately located between two adjacent LED functional structures 150. That is, herein, the LED functional layer 140 also includes multiple first openings (not shown in the figure) that are separately located between two adjacent LED functional structures 150. The isolation structures 180 are disposed in the first openings respectively.

In the embodiment of the present application, the two adjacent LED functional structures 150 are isolated by one of the isolation structures 180. The isolation structures 180 may be made from a photo-resistant or dielectric material. Further, two ends of each isolation structure 180 may be both exposed out of the LED functional layer 140, so as to isolate the two adjacent LED functional structures 150 better. For example, one end of the isolation structure 180 goes deeply into the substrate 110, while the other end thereof protrudes from a surface of the LED functional layer 140 that is far away from the substrate 110. Alternatively, two ends of each isolation structure 180 may be both flush with the two surfaces of the LED functional layer 140 respectively. Preferably, the linear width of a cross section of the isolation structure 180 ranges from 0.1 µm to 5 µm. For example, the linear width of the cross section of the isolation structure 180 may be 0.1 µm, 0.5 µm, 1 µm, 1.5 µm, 2 µm, 3 µm, or 5 µm, thus reducing the pixel pitch and enhancing the pixel density.

In the embodiment of the present application, the micro LED display 100 further includes a connection layer 190 that is located between the substrate 110 and the LED functional layer 140. That is, herein, the LED functional layer 140 is connected to the substrate 110 via the connection layer 190. Preferably, the connection layer 190 may be made from a conducive and high-adhesion material, for example, a conductive adhesive.

The LED functional structures 150 are corresponding and electrically connected to the electrode structures 120 via the connection layer 190. Each electrode structure 120 may be used as an extraction electrode for its corresponding LED functional structure 150. In a device region/display region of the micro LED display 100, the LED functional structures 150 are electrically connected to the electrode structures 120 in a one-to-one correspondence manner. In addition, in a marginal region/non-display region/peripheral region of the micro LED display 100, there may exist an LED functional structure 150 that is not electrically connected to the electrode structure 120 or an electrode structure 120 that is not electrically connected to the LED functional structure 150. In this case, the electrode structure 120 may serve as a circuit connection structure, and the LED functional structure 150 may serve as a support structure or the like.

Further, in the device region/display region of the micro LED display 100, the micro lenses 170 are in one-to-one correspondence to the LED functional structures 150. Specifically, in the device region/display region of the micro LED display 100, each micro lens 170 is located right above its corresponding LED functional structure 150 (herein, each micro lens 170 is located on a side opposite to the substrate 110). In addition, in a marginal region/non-display region/peripheral region of the micro LED display 100, there may exist an LED functional structure 150 right above which no micro lens 170 is disposed, or there may exist a micro lens 170 right below which no LED functional structure 150 is disposed. In this case, the LED functional structure 150 or the micro lens 170 may serve as a support structure or the like.

In the embodiment of the present application, the electrode layer 160 is made from a transparent conductive material, for example, indium tin oxide or indium zinc oxide. Herein, the electrode layer 160 may serve as another extraction electrode for the LED functional structure 150, to provide a common potential or the like.

In the embodiment of the present application, further, the micro LED display 100 may further include a PCB board (not shown in FIG. 1), and the circuit structure 130 is also electrically connected to the PCB board. Specifically, the electrode structure 130 disposed in the marginal region/non-display region/peripheral region of the micro LED display 100 is electrically connected to the PCB board, such that a signal can be input via the PCB board to control illumination of the pixels.

Figure 2:
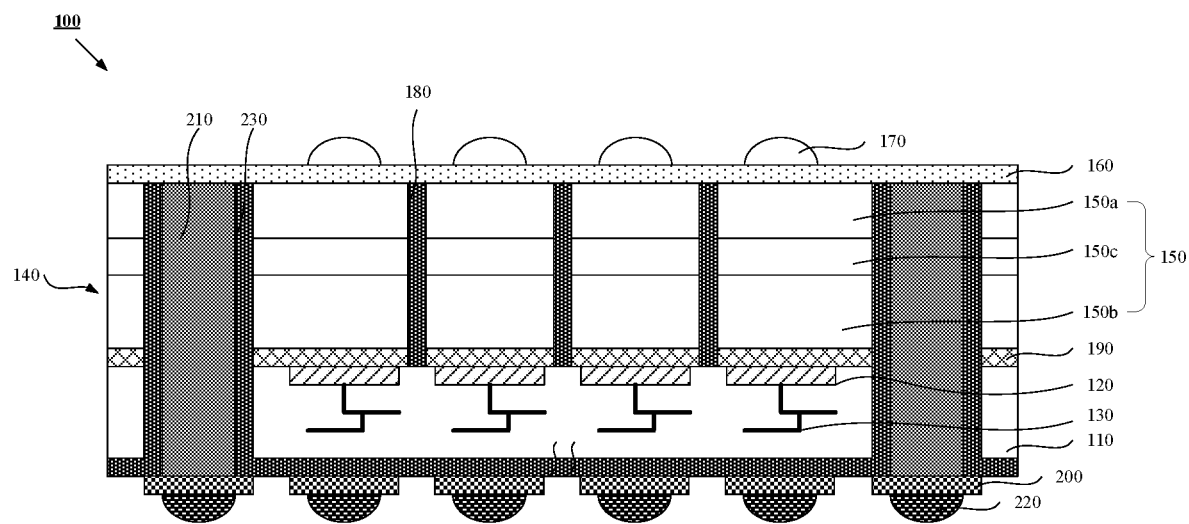
FIG. 2 is a schematic structural diagram of another part of the micro LED display according to an embodiment of the present invention.

Referring to FIG. 2, in another embodiment of the present application, a rewiring layer 200 is formed on a second surface of the substrate 110. The micro LED display 100 further includes metal pillars 210. The metal pillars 210 run through the LED functional layer 140 and the substrate 110, and is electrically connected to the rewiring layer 200 and the electrode layer 160. That is, herein, the LED functional layer 140 further includes multiple second openings (not shown in the figure), and the metal pillars 210 are disposed inside the second openings respectively. Each metal pillar 210 may be specifically a copper pillar, and located in the marginal region/non-display region/peripheral region of the micro LED display 100. The rewiring layer 200 and the electrode layer 160 can be electrically connected via the metal pillars 210, to provide common potentials for the electrode layer 160. Further, there may be multiple metal pillars 210 that are uniformly distributed in the marginal region/non-display region/peripheral region of the micro LED display 100, thus enhancing uniformity and stability of access potentials of the electrode layer 160.

Referring to FIG. 2 continuously, the micro LED display 100 may further include multiple metal pads 220 that are electrically connected to the rewiring layer 200. Specifically, the metal pads 220 may be disposed on the rewiring layer 200, such that an electric signal can be input via the metal pads 220 to control illumination of the pixels.

Preferably, the micro LED display 100 further includes an isolation sidewall 230, and the isolation sidewall 230 is located between the metal pillar 210 and the LED functional layer 140, and between the metal pillar 210 and the substrate 110. Herein, the isolation sidewall 230 is used to isolate the metal pillar 210 from the LED functional layer 140 and the substrate 110, thus avoiding interference between the pixels. Further, the isolation sidewall 230 may further extend to the second surface of the substrate 110, and (partially) cover the second surface of the substrate 110, to isolate the substrate 110 from other structures.

Figure 3:
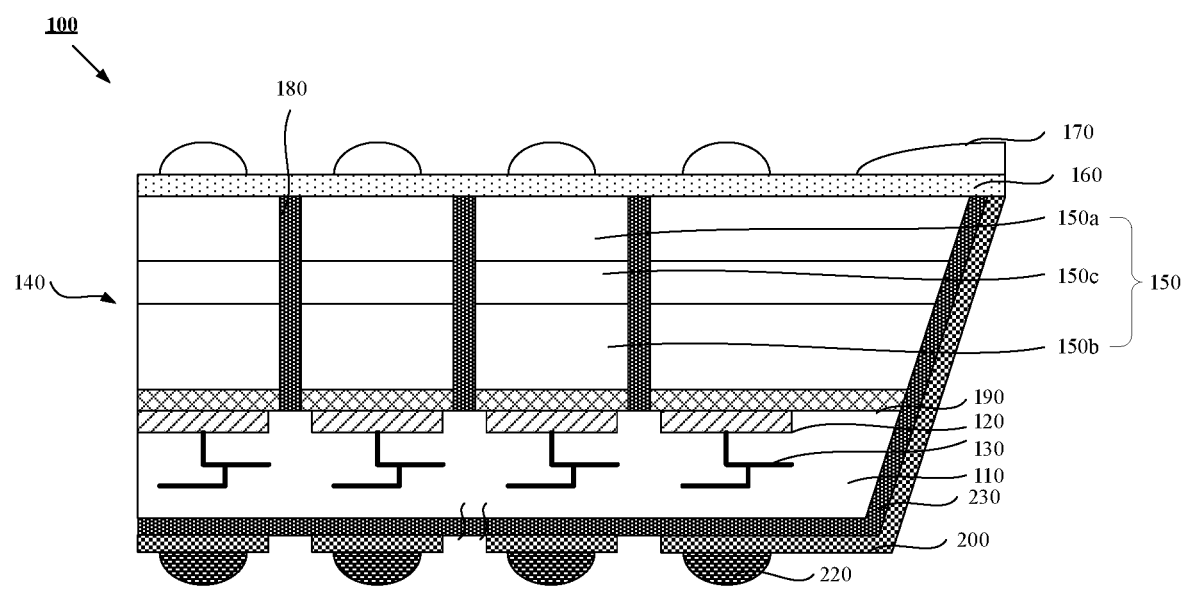
FIG. 3 is a schematic structural diagram of another part of the micro LED display according to an embodiment of the present invention.

Referring to FIG. 3, in another embodiment of the present invention, a lateral margin (a side face or a periphery) of the micro LED display 100 is a tilted plane. A rewiring layer 200 is formed on the second surface of the substrate 110, and extends across the lateral margin of the micro LED display 100, to be electrically connected to the electrode layer 160. Therefore, by using the rewiring layer 200, a common potential can be provided for the electrode layer 160. Because the lateral margin of the micro LED display 100 is a tilted plane, the rewiring layer 200 can be easily formed, ensuring connection reliability between the rewiring layer 200 and the electrode layer 160. The rewiring layer 200 may be isolated from the substrate 110 and the LED functional layer 140 via the isolation sidewall 230 on the lateral margin of the micro LED display 100. Further, the isolation sidewall 230 may extend to the second surface of the substrate 110.

Referring to FIG. 3 continuously, the micro LED display 100 may further include multiple metal pads 220 that are electrically connected to the rewiring layer 200. Specifically, the metal pads 220 may be disposed on the rewiring layer 200. An electric signal can be input via the metal pads 220 to control illumination of the pixels.

Preferably, as shown in FIG. 3, a marginal region (corresponding to the marginal region/non-display region/peripheral region of the micro LED display 100 herein) of the electrode layer 160 is covered with micro lenses 170. Further, each micro lens 170 covering the marginal region of the electrode layer 160 may be one complete micro lens, or an incomplete/partial micro lens formed after cutting. The electrode layer 160 is avoided from peeling off by using the micro lenses 170 that cover the marginal region of the electrode layer 160, thus improving the quality and reliability of the micro LED display 100.

To sum up, in the micro LED display 100 provided by the embodiment of the present invention, a plurality of electrode structures 120 is formed on a first surface of the substrate 110, and a circuit structure 130 is formed in the substrate 110 and electrically connected to the electrode structures 120. An LED functional layer 140 is located above the substrate 110, and includes a plurality of mutually isolated LED functional structures 150, where the LED functional structures 150 are corresponding and electrically connected to the electrode structures 120. An electrode layer 160 covers the LED functional layer 140 and is electrically connected to the LED functional structures 150. Micro lenses 170 are located on the electrode layer 160 and corresponding to the LED functional structures 150. Therefore, all the LED functional structures 150 can be wholly used as a light-emitting region of a pixel, improving light emission efficiency of the micro LED display 100.

Accordingly, this embodiment further provides a method of manufacturing the micro LED display described above, which mainly includes the following steps:

Step S10: A substrate is provided, where the substrate is provided with a plurality of chip areas, a plurality of electrode structures is formed on a first surface of the substrate, a circuit structure is formed in the substrate, and the circuit structure is electrically connected to the electrode structures.

Step S11: An LED functional material layer is formed on the substrate, where the LED functional material layer covers the chip areas.

Step S12: The LED functional material layer is etched, so as to form a plurality of LED functional structures and first openings that run through the LED functional material layer and are separately located between two adjacent LED functional structures.

Step S13: An isolation structure is formed in each first opening, where the isolation structure fills the first opening.

Step S14: The LED functional structures are covered with an electrode layer, where the electrode layer also covers the isolation structures.

Step S15: A plurality of micro lenses are formed on the electrode layer, where the micro lenses are corresponding to the LED functional structures.

Step S16: The multiple chip areas are sliced to form multiple independent chip structures.

Figure 4:
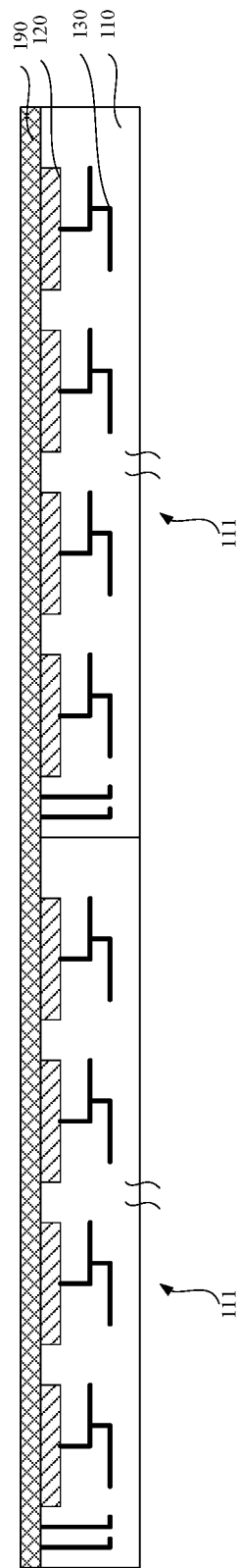
FIG. 4 to FIG. 14 are schematic partial structural diagrams of devices formed in a method of manufacturing a micro LED display according to an embodiment of the present invention.

First, referring to FIG. 4, a substrate 110 is provided. The substrate 110 is provided with a plurality of chip areas 111, a plurality of electrode structures 120 is formed on a first surface (which is the front side herein) of the substrate 110, a circuit structure 130 is formed in the substrate 110, and the circuit structure 130 is electrically connected to the electrode structures 120. Specifically, the substrate 110 is provided with a plurality of chip areas 111. A plurality of electrode structures 120 is formed on a first surface of the substrate 110 in each chip area 111, and a circuit structure 130 is formed in the substrate 110 in each chip area 111 and is electrically connected to the electrode structure 120. Specifically, in all the chip areas 111, the numbers of the electrode structures 120, specific functions and circuit forms of the circuit structures 130, and a connection relationship between the circuit structures and the electrode structures 120 may be the same or different. Further, a cut region (also referred to as a scribing region or cut channel) is provided between every two adjacent chip areas 111.

Referring to FIG. 4 continuously, in the embodiment of the present application, a connection layer 190 is formed on the substrate 110. Preferably, the connection layer 190 is made from a conductive adhesive, and may be formed on the first surface of the substrate 110 through coating. Further, the connection layer 190 may be formed on only the substrate 110 in the chip areas 111, that is, no connection layer 190 is disposed on the substrate 110 in the cut regions.

Figure 5:
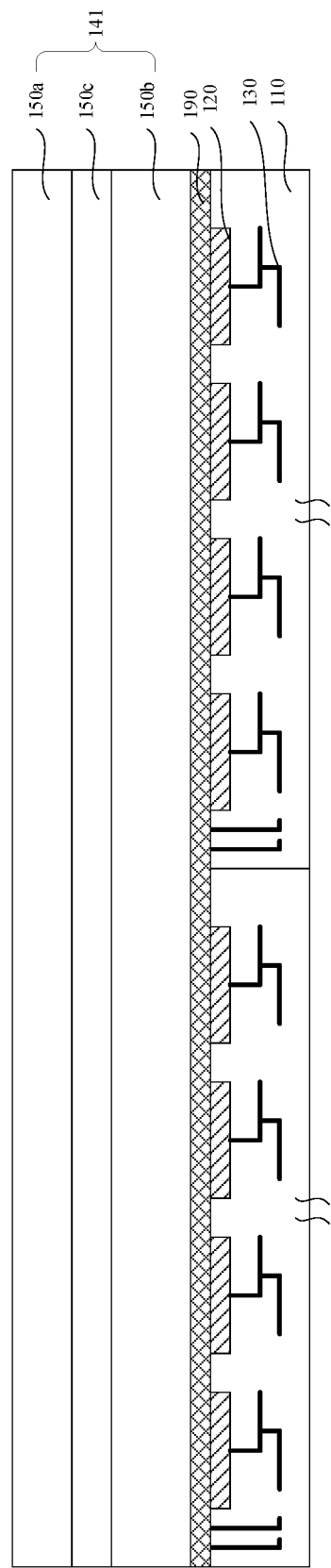
Figure 6:
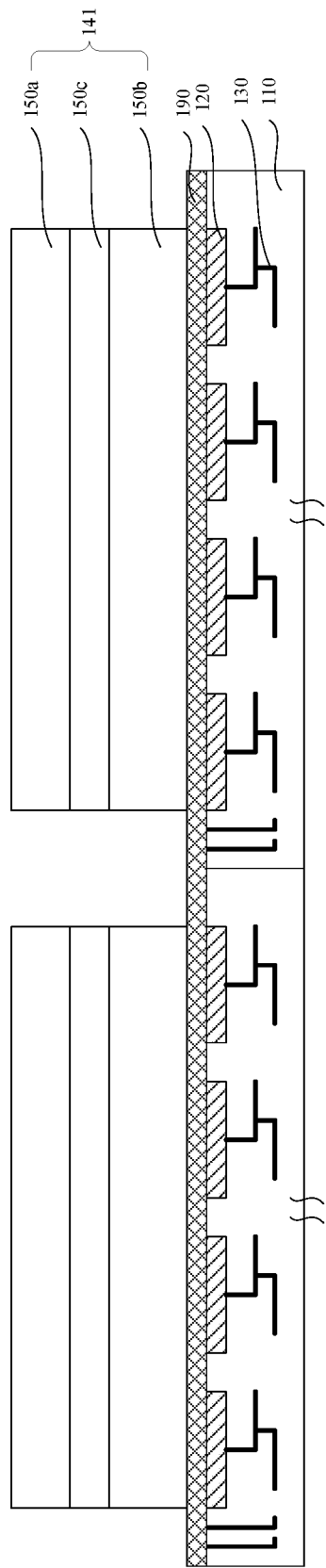

Afterwards, an LED functional material layer 141 is formed on the substrate 110. The LED functional material layer 141 covers the chip areas 111. In the embodiment of the present application, the LED functional material layer 141 may also cover the cut regions, that is, the LED functional material layer 141 that covers the chip areas 111 is integrally formed, as shown in FIG. 5 specifically. In other embodiments of the present application, the LED functional material layer 141 may not cover the cut regions, that is, the LED functional material layer 141 may include a plurality of separated LED functional material sub-layers. The LED functional material sub-layers cover the chip areas 111 respectively, and are disconnected in the cut regions, as shown in FIG. 6 specifically.

The LED functional material layer 141 may specifically include a P-type semiconductor layer 150a, an N-type semiconductor layer 150b, and a transition layer 150c between the P-type semiconductor layer 150a and the N-type semiconductor layer 150b. Further, the P-type semiconductor layer 150a of the LED functional material layer 141 may be disposed near the substrate 110, or the N-type semiconductor layer 150b of the LED functional material layer 141 may be disposed near the substrate 110. That is, from the first surface of the substrate 110, the LED functional material layer 141 may be formed by successively stacked P-type semiconductor layer 150a, transition layer 150c and N-type semiconductor layer 150b, or formed by successively stacked N-type semiconductor layer 150b, transition layer 150c and P-type semiconductor layer 150a. The transition layer may have a structure of MQWs.

Figure 7:
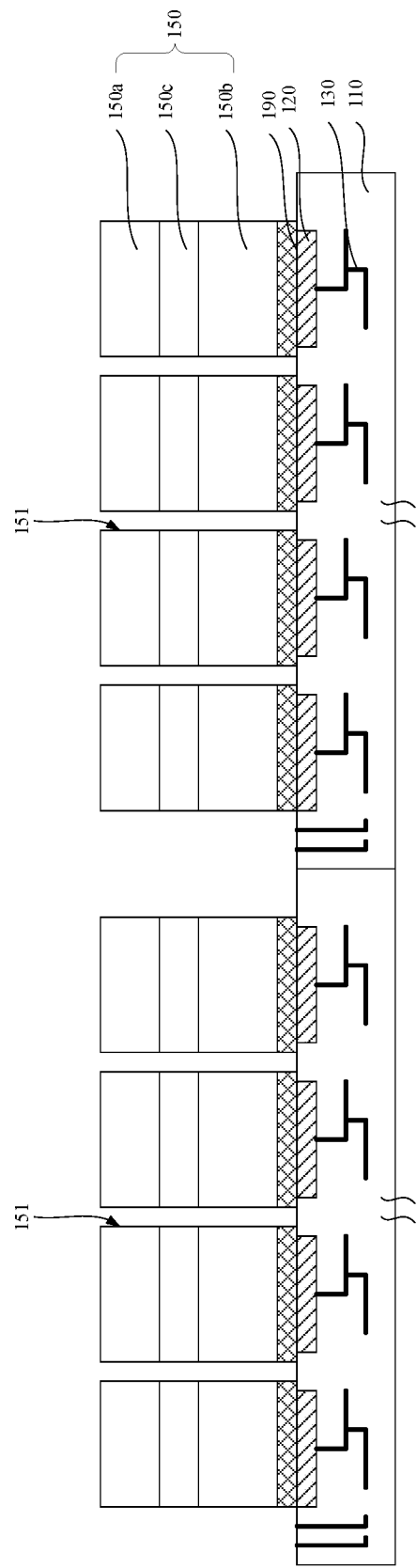

Then, as shown in FIG. 7, the LED functional material layer 141 is etched, so as to form a plurality of LED functional structures 150 and first openings 151 that run through the LED functional material layer 141 and are separately located between two adjacent LED functional structures 150. Herein, the LED functional material layer 141 above the chip areas 111 is etched, so as to form multiple LED functional structures 150 on each chip area 111 and first openings 151 that run through the LED functional material layer 141 and are separately located between two adjacent LED functional structures 150. Preferably, the diameter (the width of the cross section in an extension direction of the LED functional material layer 141) of each first opening 151 ranges from 0.1 μm to 5 μm. Further, the first openings 151 run through the connection layer 190.

In the case where the LED functional material layer 141 also covers the cut regions (that is, a structure shown in FIG. 5), multiple grooves are additionally formed during etching of the LED functional material layer 141, to expose the substrate 110 in the cut regions.

In another embodiment of the present application, referring to FIG. 2 accordingly, while the first openings 151 are formed, the LED functional material layer 141 and the substrate 110 may be further etched to form second openings (not shown in FIG. 7) that run through the LED functional material layer 141 and the substrate 110. The second openings are used in a subsequent procedure of forming metal pillars. Herein, the second openings and the first openings 151 are formed in the same step by an etching process, simplifying the process. In other embodiments of the present application, the second openings may also be formed before or after (preferably, before the micro lenses are formed) the first openings 151 are formed.

Figure 8:
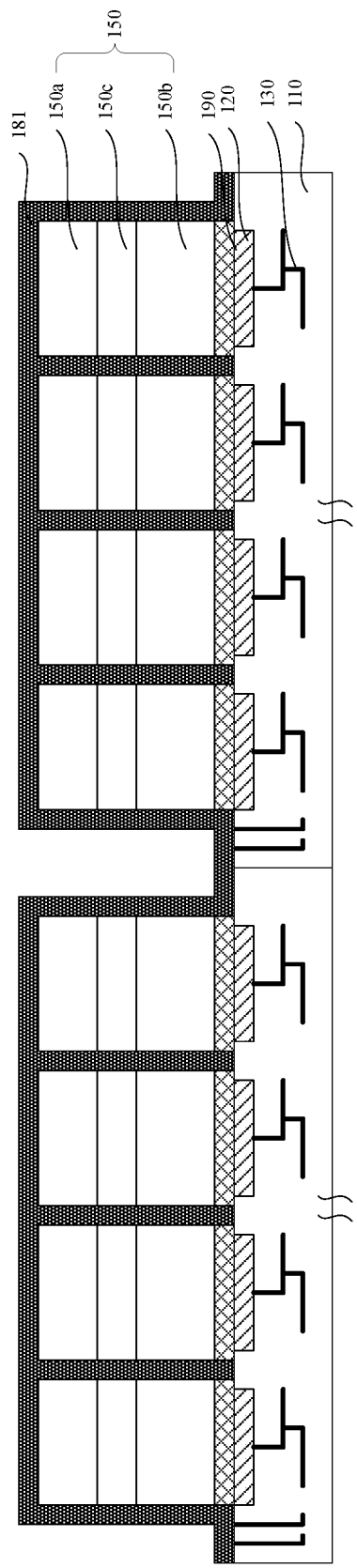

In the embodiment of the present application, as shown in FIG. 8, an isolation layer 181 is formed, where the isolation layer 181 covers the LED functional material layer 141 and fills the first openings 151. The isolation layer 181 may be made from a photo-resistant or dielectric material. In another embodiment of the present application, the isolation layer 181 may further cover sidewalls of the second openings.

Figure 9:
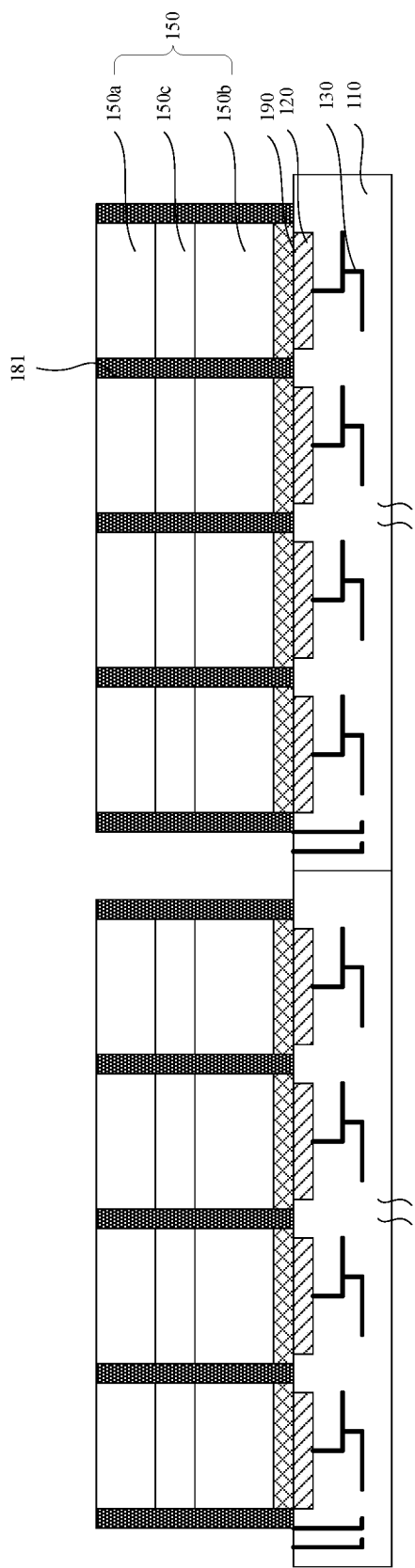

Afterwards, as shown in FIG. 9, the isolation layer 181 is patterned, and the isolation layer 181 on the top surface of the LED functional material layer 141 is removed, so as to form an isolation structure 180 in the first opening 151. Herein, the isolation structure 180 runs through the LED functional material layer 141 and the connection layer 190.

In another embodiment of the present application, as shown in FIG. 2 accordingly, metal pillars 210 are formed in the second openings, and fills the second openings. The metal pillars 210 may be specifically made from gold, silver, platinum, copper, aluminum, nickel, cobalt, etc. or an alloy containing any one of the above metals.

Figure 10:
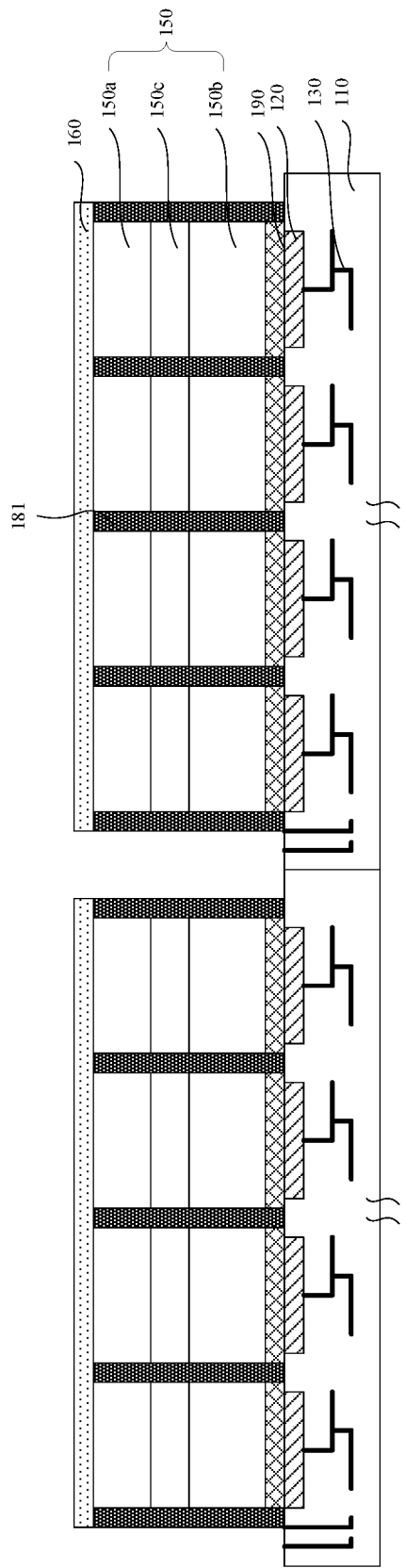

In the embodiment of the present application, further, as show in FIG. 10, the LED functional structures 150 are covered with the electrode layer 160, where the electrode layer 160 also covers the isolation structures 180. Herein, the electrode layer 160 incessantly covers the LED functional structures 150 and the isolation structures 180. The electrode layer 160 further covers the substrate 110 in the cut regions. The electrode layer 160 is made from a transparent conductive material, for example, indium tin oxide or indium zinc oxide. In another embodiment of the present application, the electrode layer 160 also covers the metal pillars 210, and is electrically connected to the metal pillars 210. After a rewiring layer 200 is formed on the second surface of the substrate 110, the metal pillars 210 are further electrically connected to the rewiring layer 200. Therefore, an electric connection between the electrode layer 160 and the rewiring layer 200 is implemented via the metal pillars 210.

Referring to FIG. 10 continuously, in the embodiment of the present application, the electrode layer 160 may be patterned subsequently, and the electrode layers 160 on the cut regions are removed, such that the electrode layers 160 above the chip areas 111 are mutually disconnected.

Figure 11:
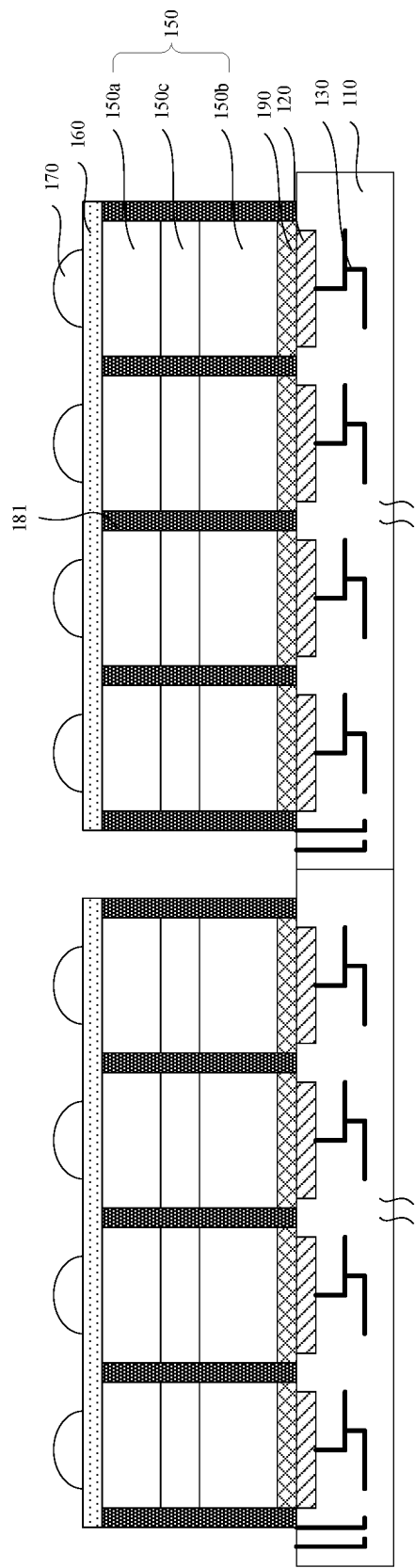

Referring to FIG. 11, in the embodiment of the present application, a plurality of micro lenses 170 is then formed on the electrode layer 160, where the micro lenses 170 are corresponding to the LED functional structures 150. Specifically, in a device region/display region of the chip area 111, the micro lenses 170 are in one-to-one correspondence to the LED functional structures 150. Further, in a marginal region/non-display region/peripheral region of each chip area 111, there may exist a micro lens 170, that is, there may exist a micro lens 170 right below which no LED functional structure 150 is disposed.

Figure 12:
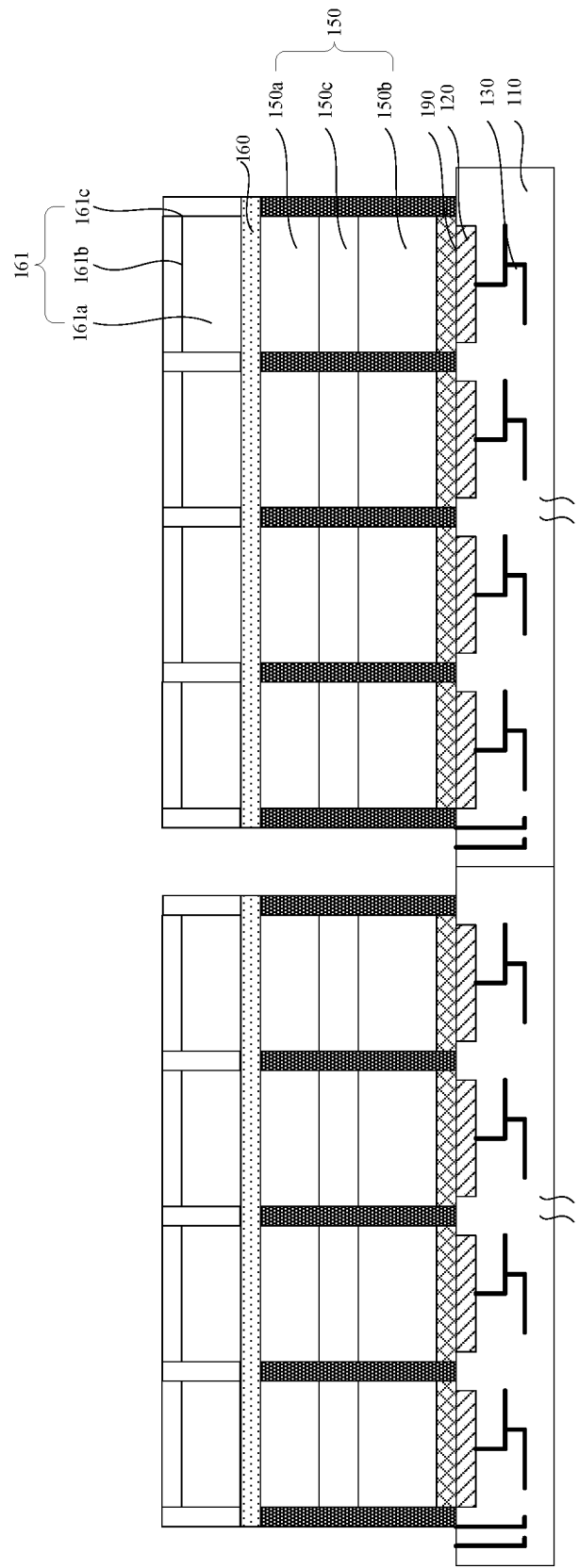

In another embodiment of the present application, before the micro lenses 170 are formed, a color resistance layer 161 may be formed on the electrode layer 160, as shown in FIG. 12. Specifically, the color resistance layer 161 may include a white phosphor coating 161a formed on the electrode layer 160 and a color filter 161b formed on the white phosphor coating 161a. The white phosphor coating 161a specifically includes a plurality of white phosphor blocks, and these white phosphor blocks are corresponding to the LED functional structures 150. For an RGB-based micro LED display, the color filter 161b may specifically include a red color filter (R), a green color filter (G), and a blue color filter (B). The red color filter (R), green color filter (G), or blue color filter (B) is formed on each white phosphor block, such that sub-pixels can select light to be emitted. Further, the color resistance layer 161 may further include a black baffle wall 161c that is disposed between two adjacent white phosphor blocks, so as to avoid inter-pixel crosstalk.

Figure 13:
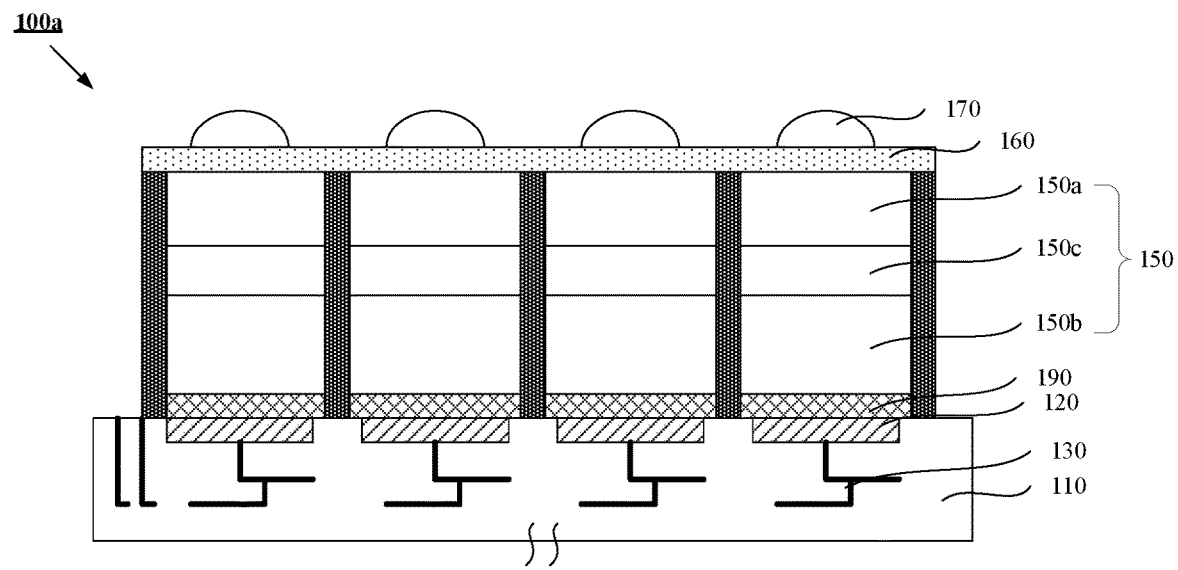

In the embodiment of the present application, subsequently, the multiple chip areas 111 may be sliced to form multiple independent chip structures 100a, and reference may be made to FIG. 13 accordingly. Specifically, the cut regions may be cut by a cutting process to singulate the multiple chip areas 111. Each independent chip structure 100a may specifically include: a substrate 110, provided with a plurality of electrode structures 120 on its first surface, where a circuit structure 130 is formed in the substrate 110 and electrically connected to the electrode structures 120; an LED functional layer 140, located above the substrate 110, and including a plurality of mutually isolated LED functional structures 150, where the LED functional structures 150 are corresponding and electrically connected to the electrode structures 120; an electrode layer 160, covering the LED functional layer 140 and electrically connected to the LED functional structures 150; and a plurality of micro lenses 170, located on the electrode layer 160 and corresponding to the LED functional structures 150.

In another embodiment of the present application, referring to FIG. 3, before singulation of the multiple chip areas 111 (preferably, after the micro lenses 170 are formed), the method further includes: forming a V-shaped notch between two adjacent chip areas 111, where the V-shaped notch runs through the substrate 110 and the LED functional material layer 141 to expose the electrode layer 160; and forming a rewiring layer 200 on the second surface of the substrate 110, where the rewiring layer 200 extends across sidewalls of the V-shaped notch and is electrically connected to the electrode layer 160. Further, multiple metal pads 220 are formed on the rewiring layer 200. Herein, the substrate 110 on the edge (and in the cut region) in each chip region 111 is etched from the second surface (which is the back side herein) of the substrate 110 by an etching process, to form the V-shaped notch between two adjacent chip areas 111, where the V-shaped notch tapers from the surface of the substrate 110 towards the LED functional material layer 141.

Figure 14:
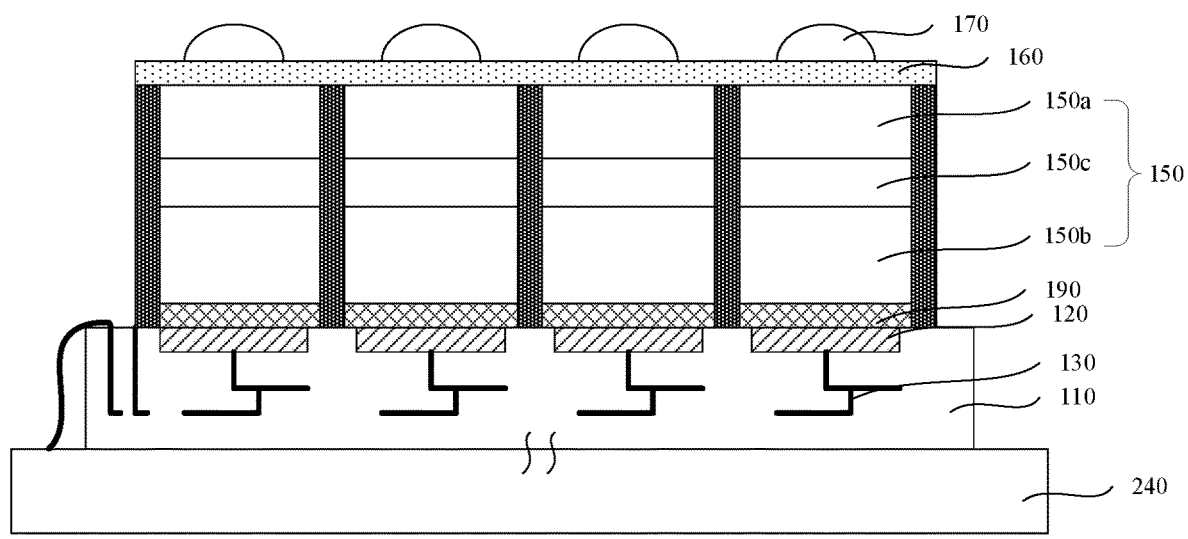

As shown in FIG. 14, in the embodiment of the present application, after the multiple chip areas 111 are sliced to form multiple independent chip structures 100a, these independent chip structures 100a are then mounted on a PCB board 240. The circuit structure 130 is further electrically connected to the PCB board 240. Specifically, an electric connection between the circuit structure 130 and the PCB board 240 may be implemented through wiring. A signal can be input by using the PCB board 240, so as to control illumination of the pixels.

To sum up, in the micro LED display and the manufacturing method thereof according to the embodiments of the present invention, a substrate is provided with a plurality of electrode structures on its first surface, where a circuit structure is formed in the substrate and electrically connected to the electrode structures; an LED functional layer is located on the substrate, and includes a plurality of mutually isolated LED functional structures, where the LED functional structures are corresponding and electrically connected to the electrode structures; an electrode layer covers the LED functional layer and is electrically connected to the LED functional structures; and micro lenses are located on the electrode layer and corresponding to the LED functional structures. Therefore, all the LED functional structures can be wholly used as a light-emitting region of a pixel, improving light emission efficiency of the micro LED display.

Further, in the method of manufacturing the micro LED display according to the embodiment of the present invention, an LED functional material layer is formed on the substrate, where the LED functional material layer covers the chip areas; and the LED functional material layer is etched, so as to form a plurality of LED functional structures and first openings that run through the LED functional material layer and are separately located between two adjacent LED functional structures, such that alignment between the LED functional structures and the substrate can be implemented. Thus, the difficulty in manufacturing the micro LED display can be reduced, and the quality and reliability of the formed micro LED display can be improved.

The above merely describes preferred embodiments of the present invention, and is not intended to limit the present invention. Any replacements and modifications made by persons of ordinary skill in the art according to the disclosed content should all fall within the protection scope of claims of the present invention.

What is claimed is:

1. A micro LED display, comprising:
   a substrate having a plurality of electrode structures formed on a first surface thereof, wherein a plurality of circuit structures are formed in the substrate and electrically connected to the plurality of electrode structures;
   an LED functional layer, formed on the substrate and comprising a plurality of LED functional structures which are mutually isolated from one another, wherein the plurality of LED functional structures is correspondingly and electrically connected to the plurality of electrode structures;
   an electrode layer, covering the LED functional layer and electrically connected to the plurality of LED functional structures; and
   a plurality of micro lenses, formed on the electrode layer and corresponding to the plurality of LED functional structures, wherein a rewiring layer is formed on a second surface of the substrate; and the micro LED display further comprises metal pillars, the metal pillars running through the LED functional layer and the substrate, and being electrically connected to the rewiring layer and the electrode layer.

2. The micro LED display of claim 1, wherein the micro LED display further comprises an isolation sidewall formed between each of the metal pillars and the LED functional layer, as well as between each of the metal pillars and the substrate.

3. The micro LED display of claim 1, wherein the micro LED display further comprises a PCB board, and the plurality of circuit structures are further electrically connected to the PCB board.

4. The micro LED display of claim 2, wherein the micro LED display further comprises a plurality of isolation structures each running through the LED functional layer and formed between two adjacent ones of the plurality of LED functional structures.

5. The micro LED display of claim 2, wherein the micro LED display further comprises a connection layer that is formed between the substrate and the LED functional layer.

6. The micro LED display of claim 5, wherein the connection layer is made from a conductive adhesive.

7. The micro LED display of claim 2, wherein each of the plurality of LED functional structures comprises a P-type semiconductor layer, an N-type semiconductor layer, and a transition layer between the P-type semiconductor layer and the N-type semiconductor layer.

8. A micro LED display, comprising:
   a substrate having a plurality of electrode structures formed on a first surface thereof, wherein a plurality of circuit structures are formed in the substrate and electrically connected to the plurality of electrode structures;
   an LED functional layer, formed on the substrate and comprising a plurality of LED functional structures which are mutually isolated from one another, wherein the plurality of LED functional structures is correspondingly and electrically connected to the plurality of electrode structures,
an electrode layer, covering the LED functional layer and electrically connected to the plurality of LED functional structures; and
a plurality of micro lenses, formed on the electrode layer and corresponding to the plurality of LED functional structures, wherein a periphery of the micro LED display is a tilted plane; a rewiring layer is formed on a second surface of the substrate, and extends across the periphery of the micro LED display and is electrically connected to the electrode layer.

9. The micro LED display of claim 8, wherein a peripheral region of the electrode layer is covered with the plurality of micro lenses.

10. The micro LED display of claim 8, wherein the micro LED display further comprises a PCB board, and the plurality of circuit structures are further electrically connected to the PCB board.

11. The micro LED display of claim 8, wherein the micro LED display further comprises a plurality of isolation structures each running through the LED functional layer and formed between two adjacent ones of the plurality of LED functional structures.

12. The micro LED display of claim 8, wherein the micro LED display further comprises a connection layer that is formed between the substrate and the LED functional layer.

13. The micro LED display of claim 12, wherein the connection layer is made from a conductive adhesive.

14. The micro LED display of claim 8, wherein each of the plurality of LED functional structures comprises a P-type semiconductor layer, an N-type semiconductor layer, and a transition layer between the P-type semiconductor layer and the N-type semiconductor layer.

15. A method of manufacturing a micro LED display, comprising:
providing a substrate, wherein the substrate is provided with a plurality of chip areas, a plurality of electrode structures are formed on a first surface of the substrate, a plurality of circuit structures are formed in the substrate, and the plurality of circuit structures are electrically connected to the plurality of electrode structures;
forming an LED functional material layer on the substrate, wherein the LED functional material layer covers the plurality of chip areas;
etching the LED functional material layer to form a plurality of LED functional structures and first openings, each of the first openings running through the LED functional material layer and formed between two adjacent ones of the plurality of LED functional structures;
forming isolation structures in the first openings, wherein each of the isolation structures fills a corresponding one of the first openings;
covering the plurality of LED functional structures with an electrode layer, wherein the electrode layer also covers the isolation structures;
forming a plurality of micro lenses on the electrode layer, wherein the plurality of micro lenses are corresponding to the plurality of LED functional structures; and
slicing the plurality of chip areas to form multiple independent chip structures.

16. The method of manufacturing a micro LED display of claim 15, wherein the LED functional material layer entirely covers the plurality of chip areas; or the LED functional material layer comprises a plurality of LED functional material regions, and each of the plurality of LED functional material region covers a corresponding one of the plurality of chip areas.

17. The method of manufacturing a micro LED display of claim 15, wherein after slicing the plurality of chip areas to form multiple independent chip structures, the method of manufacturing a micro LED display further comprises:
mounting the multiple independent chip structures on a PCB board, wherein the plurality of circuit structure are further electrically connected to the PCB board.

18. The method of manufacturing a micro LED display of claim 15, wherein the method of manufacturing a micro LED display further comprises, concurrently with or prior to or after the formation of the first openings: etching the LED functional material layer and the substrate to form second openings that run through the LED functional material layer and the substrate; and
wherein the method of manufacturing a micro LED display further comprises, before the formation of the electrode layer: forming metal pillars in the second openings, wherein the metal pillars fill the second openings.

19. The method of manufacturing a micro LED display of claim 15, wherein after the plurality of micro lenses are formed, the method of manufacturing a micro LED display further comprises:
forming a V-shaped notch between two adjacent ones of the plurality of chip areas, wherein the V-shaped notch runs through the substrate and the LED functional material layer to expose the electrode layer; and
forming a rewiring layer on a second surface of the substrate, wherein the rewiring layer extends across a sidewall of the V-shaped notch and is electrically connected to the electrode layer.

* * * * *